(12) United States Patent
Huang et al.

(10) Patent No.: US 10,886,304 B2
(45) Date of Patent: Jan. 5, 2021

(54) ARRAY SUBSTRATE, MANUFACTURING METHOD THEREOF, DISPLAY DEVICE

(71) Applicant: BOE TECHNOLOGY GROUP CO., LTD., Beijing (CN)

(72) Inventors: Hua Huang, Beijing (CN); Yoonsung Um, Beijing (CN); Shi Shu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/431,445

(22) Filed: Jun. 4, 2019

(65) Prior Publication Data

US 2020/0127010 A1    Apr. 23, 2020

(30) Foreign Application Priority Data

Oct. 23, 2018    (CN) .......................... 2018 1 1238606

(51) Int. Cl.
*H01L 27/12*    (2006.01)
*G02F 1/1362*    (2006.01)

(52) U.S. Cl.
CPC ...... *H01L 27/124* (2013.01); *G02F 1/136209* (2013.01); *G02F 1/136286* (2013.01); *H01L 27/1218* (2013.01); *H01L 27/1288* (2013.01)

(58) Field of Classification Search
CPC ............. H01L 27/124; G02F 1/136209; G02F 1/136286
See application file for complete search history.

(56) References Cited

U.S. PATENT DOCUMENTS

| | | | |
|---|---|---|---|
| 2006/0146254 A1* | 7/2006 | Kim | G02F 1/134363 349/141 |
| 2011/0157534 A1* | 6/2011 | Hong | G02F 1/134363 349/141 |
| 2014/0042464 A1 | 2/2014 | Guo | |
| 2014/0159086 A1 | 6/2014 | Yu et al. | |
| 2017/0090245 A1* | 3/2017 | Tsuchiya | G02F 1/134336 |
| 2018/0180931 A1 | 6/2018 | Shen et al. | |

FOREIGN PATENT DOCUMENTS

| | | |
|---|---|---|
| CN | 102809860 A | 12/2012 |
| CN | 103852941 A | 6/2014 |
| CN | 105892142 A | 8/2016 |
| KR | 100835402 B1 | 6/2008 |

OTHER PUBLICATIONS

"First Office Action and English language translation", CN Application No. 201811238606.3, dated Nov. 4, 2020, 13 pp.

* cited by examiner

*Primary Examiner* — Christine A Enad
(74) *Attorney, Agent, or Firm* — Myers Bigel, P.A.

(57) ABSTRACT

An array substrate, a manufacturing method thereof and an application of the array substrate are provided. The array substrate comprises a substrate and a data line above the substrate, the data line comprising a first surface closest to the substrate and parallel to a bottom surface of the substrate. The array substrate further comprises a light shielding layer above the substrate, and the light shielding layer is configured to cover the data line, such that at least a portion of the data line in the display area of the array substrate is not exposed. When the array substrate is applied to a display device, the amount of light leakage at the data line can be reduced.

15 Claims, 5 Drawing Sheets

ARRAY SUBSTRATE, MANUFACTURING METHOD THEREOF, DISPLAY DEVICE

RELATED APPLICATION

The present application claims the benefit of Chinese Patent Application No. 201811238606.3, filed on Oct. 23, 2018, the entire disclosure of which is incorporated herein by reference.

TECHNICAL FIELD

The present disclosure relates to the field of display technologies, and specifically to an array substrate, a manufacturing method thereof, and a display device.

BACKGROUND

As customers' demands on performance of display devices increase, the market has put higher and higher requirements on display devices, for example, the requirement on the resolution of a display device (such as a television (TV)) is increasing. However, increasing the resolution of a display device would degrade the light transmittance of the display device. For liquid crystal display devices of various types, such as VA, IPS, ADS, TN and the like, there is great space to improve the light transmittance.

SUMMARY

An embodiment of the present disclosure provide an array substrate. The array substrate comprises a substrate and a data line above the substrate, the data line comprising a first surface closest to the substrate and parallel to a bottom surface of the substrate. The array substrate further comprises a light shielding layer above the substrate, the light shielding layer is configured to cover the data line such that at least a portion of the data line in a display area of the array substrate is not exposed.

According to some embodiments of the disclosure, the data line comprises an upper surface extending along a length direction of the data line and two side faces connecting the upper surface and the first surface, the light shielding layer comprises a first portion in contact with the upper surface, and a second portion in contact with one of the two side faces, the second portion of the light shielding layer comprises an outer surface inclined relative to the first surface of the data line, an angle between the outer surface and the first surface is greater than or equal to 450 and less than or equal to 900.

According to some embodiments of the disclosure, the first portion of the light shielding layer has a thickness greater than or equal to 2.8 µm.

According to some embodiments of the disclosure, a distance between an outermost edge of the second portion of the light shielding layer and one of the two side faces of the data line in contact with the second portion is greater than or equal to 4.2 µm.

According to some embodiments of the disclosure, the array substrate further comprises a first common electrode and a second common electrode located above the light shielding layer, a first gap is present between an orthographic projection of the first common electrode on the substrate and an orthographic projection of the data line on the substrate, and a second gap is present between an orthographic projection of the second common electrode on the substrate and the orthographic projection of the data line on the substrate, and sizes of the first gap and the second gap are both less than or equal to 1 µm.

According to some embodiments of the disclosure, the array substrate further comprises a first common electrode and a second common electrode above the light shielding layer, an orthographic projection of the first common electrode on the substrate and an orthographic projection of the data line on the substrate have an overlapping region, and an orthographic projection of the second common electrode on the substrate and the orthographic projection of the data line on the substrate have an overlapping region.

According to some embodiments of the disclosure, the array substrate further comprises a first common electrode and a second common electrode above the light shielding layer, a gap between an orthographic projection of one of the first common electrode and the second common electrode on the substrate and an orthographic projection of the data line on the substrate has a size less than or equal to 1 µm, and an orthographic projection of the other of the first common electrode and the second common electrode on the substrate and the orthographic projection of the data line on the substrate have an overlapping region.

According to some embodiments of the disclosure, the array substrate further comprises a pixel electrode and a common electrode, the pixel electrode and the common electrode are arranged above the light shielding layer in a vertical direction perpendicular to the bottom surface of the substrate, the common electrode comprises a plurality of electrode blocks spaced apart from each other.

According to some embodiments of the disclosure, the array substrate further comprises a thin film transistor, and a passivation layer between the pixel electrode and the common electrode, one of a source and a drain of the thin film transistor is electrically connected to the pixel electrode.

A further embodiment of the disclosure provides a display device comprising the array substrate according to any one of the foregoing embodiments.

Yet another embodiment of the disclosure provides a method for manufacturing the array substrate according to the above embodiments, the method comprises: forming the data line on the substrate, the data line comprising the first surface closest to the substrate and parallel to the bottom surface of the substrate, an upper surface extending along a length direction of the data line, and side faces connecting the upper surface and the first surface; forming a first preparation layer on the upper surface of the data line with a light shielding material; heating the first preparation layer such that a material of the first preparation layer covers the side faces of the data line to obtain the light shielding layer.

According to some embodiments of the disclosure, the method further comprises: forming a gate, a gate insulating layer and an active layer on the substrate successively; forming a metal thin film covering the gate, the gate insulating layer and the active layer; forming a primary preparation layer on the metal thin film using a light shielding material, and performing a patterning process to the primary preparation layer to form a first preparation layer and a second preparation layer separated from each other; etching the metal thin film using the first preparation layer and the second preparation layer as a mask plate to form a source, a drain, and the data line, and removing the second preparation layer above the source and the drain.

According to some embodiments of the disclosure, the method further comprises: after forming the source, the drain, and the data line, performing ashing treatment to a portion of the active layer between the source and the drain.

DETAILED DESCRIPTION OF EMBODIMENTS

Embodiments of the present disclosure are described in detail below. The embodiments below are exemplary for illustrating the present disclosure only, and cannot be construed as limiting the protection scope of the application. Where specific techniques or conditions are not indicated in embodiments, the embodiments are implemented according to the techniques or conditions described in the literature in the art or according to the product specification. The reagents or instruments whose manufacturers are not indicated are conventional commercially available products.

An embodiment of the disclosure provides an array substrate comprising a substrate and a data line above the substrate. The data line comprises a first surface that is closest to the substrate and parallel to a bottom surface of the substrate. The array substrate further comprises a light shielding layer located above the substrate. The light shielding layer is configured to cover the data line such that at least a portion of the data line in the display area of the array substrate is not exposed.

The array substrate provided by the embodiment of the disclosure is applicable to various types of liquid crystal displays to thereby reduce light leakage of the display device and enhance the light transmittance of the display device, which will be specifically described in conjunction with the following examples.

In order to further illustrate the array substrate provided by the embodiment of the disclosure, the structure of the array substrate will be further described below based on an example where the array substrate is applied in an ADS mode display device.

Figure 1:
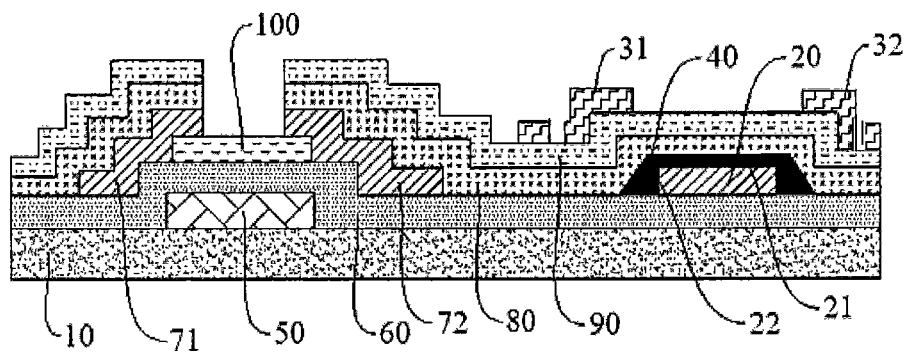
FIG. 1 is a schematic partial sectional view of an array substrate in an embodiment of the present disclosure.

FIG. 1 schematically shows a partial sectional view of an array substrate which can be used in an ADS liquid crystal display device. As shown in FIG. 1, the array substrate comprises a substrate 10 and a data line above the substrate 10. The data line 20 has a first surface (i.e., the lower surface of the data line 20 in FIG. 1) closest to the substrate 10 and parallel to the bottom surface of the substrate 10. The array substrate further comprises a light shielding layer 40 located over the substrate 10. The light shielding layer 40 covers the data line 20, such that at least a portion of the data line 20 in the display area of the array substrate is completely not exposed. It can be understood that the data line of the array substrate may extend beyond the display area, the light shielding layer 40 covering the data line 20 at least enables the portion of the data line located in the display area of the array substrate to be completely not exposed. With the light shielding layer 40, the amount of light leakage at the data line 20 can be reduced. Furthermore, an electric field that may exist between the data line and other electrodes (e.g., the common electrode to be described hereinafter) of the array substrate can be shielded by the light shielding layer 40 such that the electric field does not affect the liquid crystal molecules, which can further reduce the amount of light leakage.

The array substrate of FIG. 1 further shows a thin film transistor electrically connected to the data line 20, a pixel electrode and a common electrode. As shown in FIG. 1, the thin film transistor comprises a gate 50 on the substrate 10, a gate insulating layer 60 disposed on the substrate and covering the gate 50, an active layer 100 on the gate insulating layer 60, and a source 71 and a drain 72 that are arranged on the gate insulating layer 60 and in contact with the active layer 100. The data line 20, and the source 71 and the drain 72 may be formed in the same patterning process. A pixel electrode 80 is disposed over the source 71, the drain 72 and the light shielding layer 40, a passivation layer 90 is arranged on the pixel electrode 80, and a common electrode is disposed on the passivation layer 90. In the example of FIG. 1, the common electrode is a patterned electrode, that is, it may comprise a plurality of electrode blocks or electrode strips spaced apart from each other, which electrode blocks or electrode strips may be electrically connected to each other in a suitable manner. FIG. 1 schematically shows a first common electrode 31 for a pixel and a second common electrode 32 for another adjacent pixel. The first common electrode 31 and the second common electrode 32 are both patterned electrodes, and they each comprise a plurality of electrode blocks or electrode strips spaced apart from each other, which electrode blocks or electrode strips can be electrically connected to each other to a common potential. In case a display device to which the array substrate is applied is in operation, the patterned common electrode may generate an electric field with the pixel electrode that causes the liquid crystal molecules to deflect in a horizontal direction.

According to the embodiment of the disclosure, the materials for forming the above structures are not limited, and those skilled in the art can make flexible selections as needed. In some embodiments of the disclosure, the material for forming the substrate 10 includes, but is not limited to, a metal (if a metal substrate is employed, a buffer layer is further disposed between the metal substrate and the gate), a polymer or glass. The materials for the gate insulating layer 60 and the passivation layer 90 are selected from inorganic materials such as silicon nitride, silicon oxide, silicon oxynitride and the like or organic insulating materials such as polysiloxane, acryl, polyimide, and the like. The material for forming the active layer 100 includes, but is not limited to, polysilicon, amorphous silicon and indium gallium zinc oxide. The materials for forming the common electrode and the pixel electrode 80 may be independent, including but not limited to indium tin oxide. The materials for forming the source 71, the drain 72 and the data line 20 are independent, including but not limited to metals such as silver, copper, aluminum, molybdenum and the like, or metal alloys, or conductive oxides. According to an embodiment of the present disclosure, the material for forming the light shielding layer comprises a black resin (it is to be noted that the resin material is not a complete insulator, and the dielectric constant thereof is generally about 3, so that it can shield an electric field). Thus, the light shielding layer 40 can not only reduce the amount of light leakage at the data line 20, but also well shield an electric field between the data line 20 and the common electrode, so that the electric field would not affect the liquid crystal molecules, which can further reduce the amount of light leakage.

Figure 2:
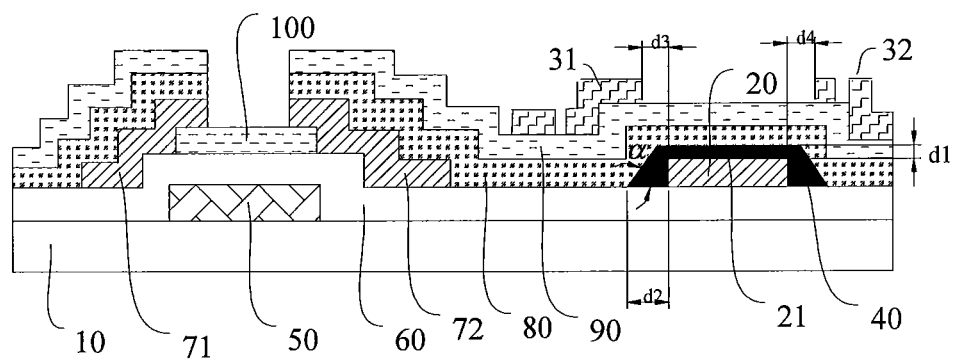
FIG. 2 is a schematic partial sectional view of an array substrate in another embodiment of the present disclosure.

As described above, the arrangement of the light shielding layer may reduce light leakage at the data line. According to an embodiment of the present disclosure, the light shielding layer comprises a first portion in contact with the upper surface of the data line, and a second portion in contact with a side face extending along a length direction of the data line. As shown in FIG. 2, the second portion of the light shielding layer 20 has an outer surface inclined relative to the first surface of the data line, and an angle α between the outer surface and the first surface of the data line 20 is greater than or equal to 45°, and less than or equal to 90°, thereby further achieving the effect of reducing the amount of light leakage. The angle between the outer surface and the first surface of the data line 20 is, for example, 45°, 50°, 55°, 60°, 65°, 70°, 75°, 80°, 85° or 90° Moreover, as the angle α increases, light leakage near the data line can be further reduced, such that the light transmittance is further enhanced.

Referring to FIG. 2, in another embodiment, the first portion of the light shielding layer has a thickness d1 greater than or equal to 2.8 µm, such as 2.8 µm, 2.9 µm, 3.0 µm, 3.1 µm, so that the amount of light leakage can be further reduced, and the light transmittance of a display device comprising the array substrate can be enhanced. According to some experiments, if d1 is less than 2.8 µm, the light shielding effect of the light shielding layer is relatively poor. On the premise of keeping other conditions the same, when the d1 is set to be 2.2 µm, the light leakage rate is 2.7%, and when d1 is 2.8 µm, almost no light leakage occurs.

According to an embodiment of the present disclosure, as shown in FIG. 2, a distance d2 between the outermost edge of the second portion of the light shielding layer and the side face of the data line in contact with the second portion may be determined by the theoretical value of d2 that ensures no light leakage in a dark state, the width of process margin for forming the light shielding layer, and the width of the dark-state portion at the sidewall of the bright-state light shielding layer, that is, d2 is greater than or equal to the width of the dark-state portion at the sidewall of the bright-state light shielding layer being subtracted from the sum of the theoretical value of d2 that ensures no light leakage in a dark state and the width of process margin for forming the light shielding layer. In some embodiments, the distance d2 between the outermost edge of the second portion of the light shielding layer 40 and the side face of the data line 20 in contact with the second portion is greater than or equal to 4.2 µm, such as 4.2 µm, 4.5 µm, 4.8 µm, 5.0 µm, 5.2 µm, 5.5 µm, 5.8 µm or 6.0 µm. In an example, the theoretical width of d2 that ensures no light leakage in a dark state is 4 µm, the width of process margin for forming the light shielding layer is 1 µm, and the width of the dark-state portion at the sidewall of the bright-state light shielding layer is 0.8 µm, so d2>4 µm+1 µm-0.8 µm=4.2 µm. Thus, it can further decrease the light leakage rate, enhance the light transmittance, and further improve the display quality of a display panel. The bright state and the dark state referred to herein mean that a display panel or display device is in a bright state or a dark state, and the dark-state portion at the sidewall of the bright-state light shielding layer means a portion in a dark state at the sidewall of the light shielding layer when the display panel or display device is in a bright state. In an example, the physical value of the width of the dark-state portion at the sidewall of the bright-state light shielding layer is 2.0 µm. In consideration of the liquid crystal efficiency, the equivalent width of the dark-state portion at the sidewall of the bright-state light shielding layer is 0.8 µm.

In an embodiment, the theoretical value of d2 that ensures no light leakage in a dark state is obtained by means of software simulation. At the time of making the light shielding layer, the light shielding layer cannot be fabricated completely according to the designed value. There will be a process deviation, and this deviation is the process margin described above.

According to an embodiment of the present disclosure, referring to FIG. 2, the patterned first common electrode 31 and the patterned second common electrode 32 are disposed spaced apart from each other on a side of the light shielding layer 40 away from the data line 20. In FIG. 2, the first common electrode and the second common electrode are disposed on the surface of the passivation layer 90, and the pixel electrode 80 is below the passivation layer 90. Thus, the pixel electrode 80 and the patterned common electrodes can generate a transverse electric field for driving liquid crystals. In the example of FIG. 2, the first common electrode 31 and the second common electrode 32 serve as common electrodes of two adjacent pixels, respectively.

Figure 3:
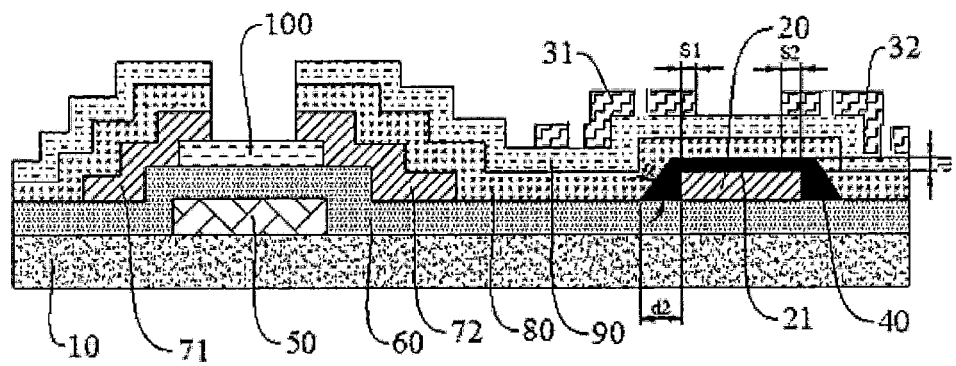
FIG. 3 is a schematic partial sectional view of an array substrate in another embodiment of the present disclosure.
Figure 4:
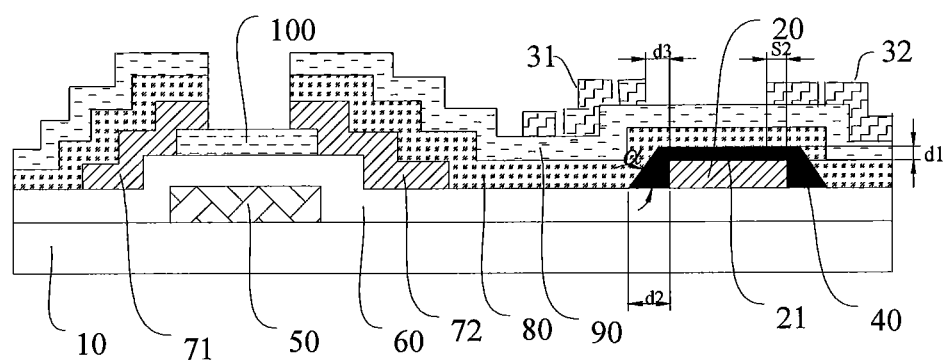
FIG. 4 is a schematic partial sectional view of an array substrate in another embodiment of the present disclosure.

According to an embodiment of the disclosure, the positional relationship between the common electrodes (comprising the first common electrode 31 and the second common electrode 32) and the data line may exert certain influence on light leakage of the array substrate. In order to further reduce the amount of light leakage, in some embodiments of the disclosure, referring to FIG. 2, a first gap is present between the orthographic projection of the first common electrode 31 on the substrate 10 and the orthographic projection of the data line 20 on the substrate, and a second gap is present between the orthographic projection of the second common electrode 32 on the substrate 10 and the orthographic projection of the data line 20 on the substrate 10. A value of the first gap d3 and a value of the second gap d4 are both less than or equal to 1 µm. In some other embodiments, referring to FIG. 3, the orthographic projection of the first common electrode 31 on the substrate 10 and the orthographic projection of the data line 20 on the substrate 10 have an overlapping region S1, and the orthographic projection of the second common electrode 32 on the substrate and the orthographic projection of the data line 20 on the substrate 10 have an overlapping region S2. In still other embodiments of the present disclosure, referring to FIG. 4 (only an example is shown), a gap d3 between the orthographic projection of one of the first common electrode 31 and the second common electrode 32 on the substrate and the orthographic projection of the data line 20 on the substrate has a value less than or equal to 1 µm, and the orthographic projection of the other of the first common electrode 31 and the second common electrode 32 on the substrate and the orthographic projection of the data line 20 on the substrate have an overlapping region S2. As a result, it can be better ensured that an electric field between the data line and the common electrodes is shielded by the light shielding layer, so that the electric field does not act on the liquid crystal molecules, which can further reduce the amount of light leakage and enhance the light transmittance of a display device comprising the array substrate, and improve the display quality of the display device.

In summary, for the embodiments shown in FIG. 1 to FIG. 4, the array substrate comprises the pixel electrode 80 and the common electrodes 31, 32, and the pixel electrode and the common electrodes are arranged above the light shielding layer 40 in the vertical direction perpendicular to the bottom surface of the substrate. The common electrodes 31, 32 comprise a plurality of electrode blocks spaced apart from each other. Further, the array substrate further comprises a thin film transistor, and a passivation layer 90 between the pixel electrode 80 and the common electrodes 31, 32. One of the source 71 and the drain 72 of the thin film transistor is electrically connected to the pixel electrode 80. An example of an ADS mode display device has been described above, and those skilled in the art can make any appropriate modification to the given example to obtain ADS mode display devices of other configurations.

According to some embodiments of the disclosure, the first portion of the light shielding layer in contact with the upper surface of the data line has a thickness of 2.8 μm. An angle between the outer surface of the second portion of the light shielding layer and the first surface of the data line is 60°. A distance between the outermost edge of the second portion of the light shielding layer and the side face of the data line in contact with the second portion is 4.2 μm. There are gaps between each of the orthographic projections of the first common electrode and the second common electrode for two adjacent pixels on the substrate and the orthographic projection of the data line on the substrate, and the gaps have a size of about 1 μm. Simulation of the light transmittance of a display panel comprising the array substrate is performed. The result of simulation shows that the light transmittance of this display panel is 111.60% with respect to the light transmittance of a display panel not provided with the light shielding layer. That is, compared to a display panel not provided with the light shielding layer, the light transmittance of the display panel comprising the array substrate provided by the embodiment of the disclosure is enhanced by 11.6%. Further, if the light shielding layer is only disposed on the upper surface of the data line without surrounding the side surfaces of the data line, the simulated light transmittance in this case is 107% with respect to the light transmittance of the display panel not provided with the light shielding layer. By comparison, it can be appreciated that the array substrate provided by the embodiments of the disclosure can significantly enhance the light transmittance of a display panel, thereby improving the image quality.

In another aspect, the present disclosure provides a method for manufacturing the array substrate described in the foregoing embodiments. According to an embodiment of the disclosure, the method comprises the following steps: forming a data line on a substrate, the data line comprising a first surface closest to the substrate and parallel to a bottom surface of the substrate, an upper surface extending along a length direction thereof, and side faces connecting the upper surface and the first surface; forming a first preparation layer on the upper surface of the data line with a light shielding material; heating the first preparation layer so that the material of the first preparation layer covers the side faces of the data line to obtain the light shielding layer. As a result, the light shielding layer is formed on both the upper surface and the side faces of the data line, thereby reducing the amount of light leakage at the data line. Further, an electric field between the data line and the subsequently formed common electrodes can be shielded by the light shielding layer, such that the electric field would not affect the liquid crystal molecules, thereby reducing the amount of light leakage.

Figure 5:
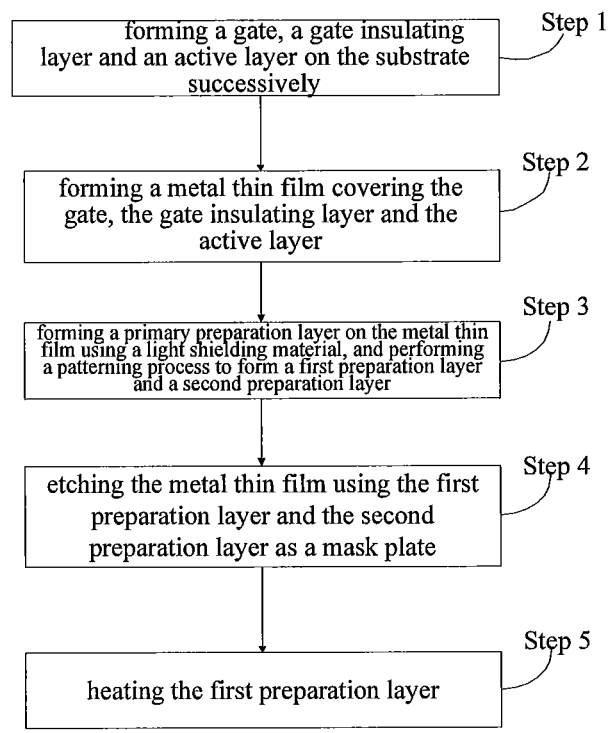
FIG. 5 is a flow chart of a method for manufacturing an array substrate in another embodiment of the present disclosure.
Figure 6:
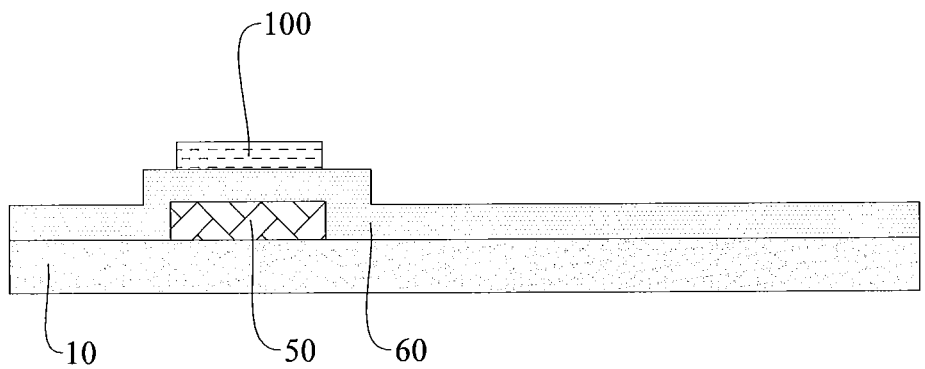
FIG. 6 is a schematic partial sectional view of an array substrate during the process of manufacturing an array substrate in another embodiment of the present disclosure.

According to some embodiments of the disclosure, the method for manufacturing an array substrate further comprises: forming a gate, a gate insulating layer, and an active layer on the substrate successively; forming a metal thin film covering the gate, the gate insulating layer, and the active layer; forming a primary preparation layer on the metal thin film with a light shielding material, and performing a patterning process to the primary preparation layer to form the first preparation layer and a second preparation layer separated from the first preparation layer; etching the metal thin film using the first preparation layer and the second preparation layer as a mask plate to form a source, a drain and the data line, and then removing the second preparation layer above the source and the drain. FIG. 5 schematically shows main steps of the method for manufacturing an array substrate provided by an embodiment of the present disclosure. FIG. 6 schematically shows a substrate on which a gate, a gate insulating layer, and an active layer have been formed. As shown in FIG. 6, a gate 50, a gate insulating layer 60, and an active layer 100 are formed on a substrate 10 successively. According to the embodiments of the disclosure, the process of forming the gate, the gate insulating layer, and the active layer is not limited. 30o Those skilled in the art can flexibly adopt a conventional manufacturing method in the art as needed, and no limitation is imposed in this respect herein. In addition, the materials for forming the gate, the gate insulating layer, and the active layer are the same as those described above, and will not be further described herein.

Figure 7:
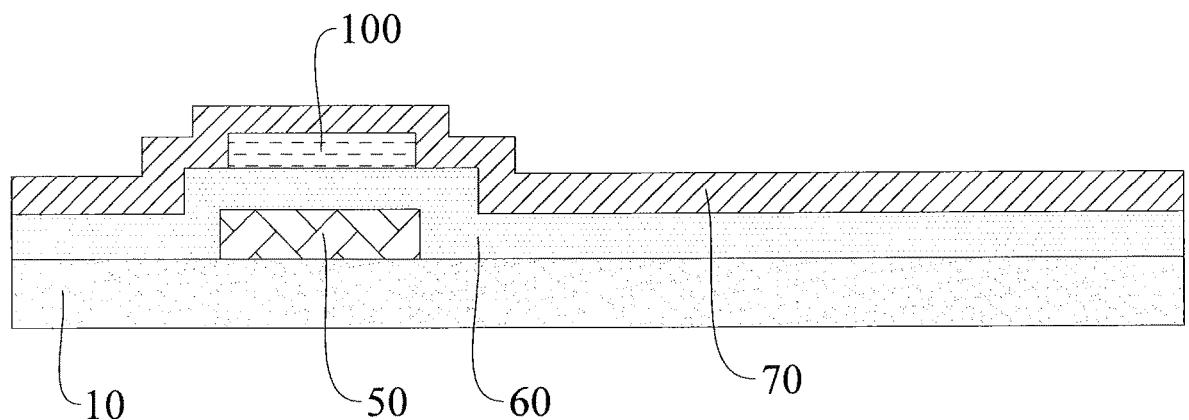
FIG. 7 is a schematic partial sectional view of an array substrate during the process of manufacturing an array substrate in another embodiment of the present disclosure.

Next, as shown in FIG. 7, a metal thin film 70 is formed above the substrate, and metal thin film 70 covers the gate, the gate insulating layer, and the active layer 100.

According to embodiments of the present disclosure, the method of forming the metal thin film 70 includes, but is not limited to, physical vapor deposition (such as magnetron sputtering) or chemical vapor deposition (plasma enhanced chemical vapor deposition). Thus, the process is mature and simple, and it is easy to operate and realize industrial production.

Figure 8:
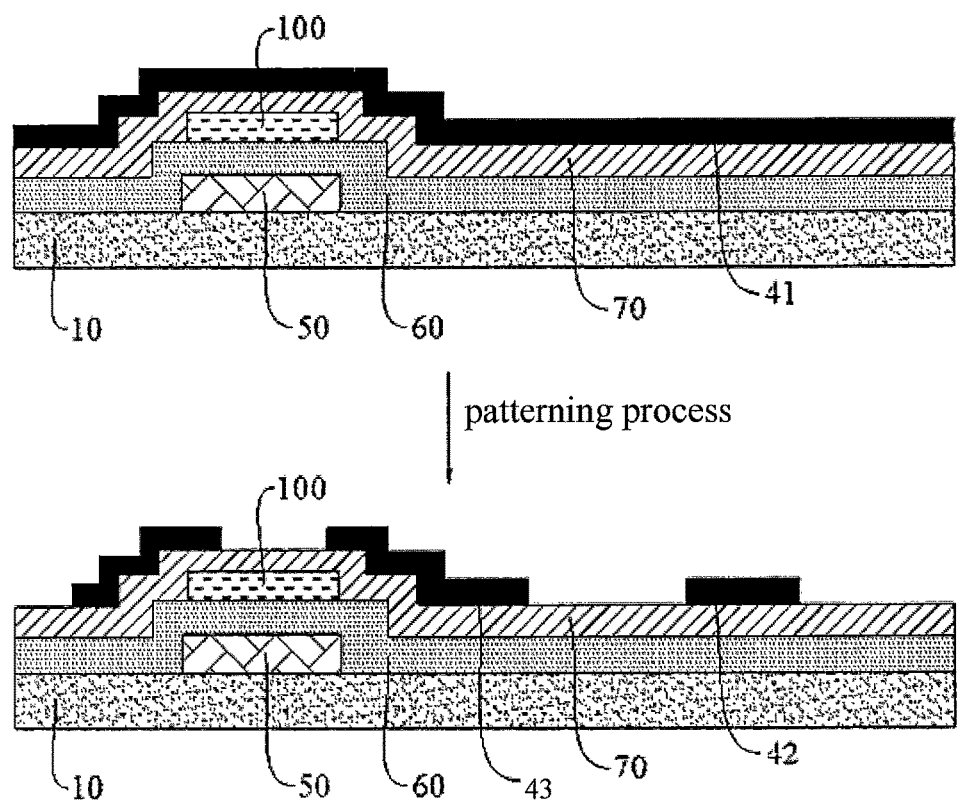
FIG. 8 is a schematic partial sectional view of an array substrate during the process of manufacturing an array substrate in another embodiment of the present disclosure.

Thereafter, a primary preparation layer is formed on the metal thin film with a light shielding material, and the primary preparation layer is patterned to form the first preparation layer and a second preparation layer separated from the first preparation layer. The first preparation layer 42 is located on the upper surface of the data line, and the second preparation layer 43 is separated from the first preparation layer 42, which are schematically shown in FIG. 8.

According to an embodiment of the disclosure, the above patterning process may comprise performing exposure and development to the primary preparation layer 41 using a mask plate, and performing etching to obtain the first preparation layer 42 and the second preparation layer 43.

Figure 9:
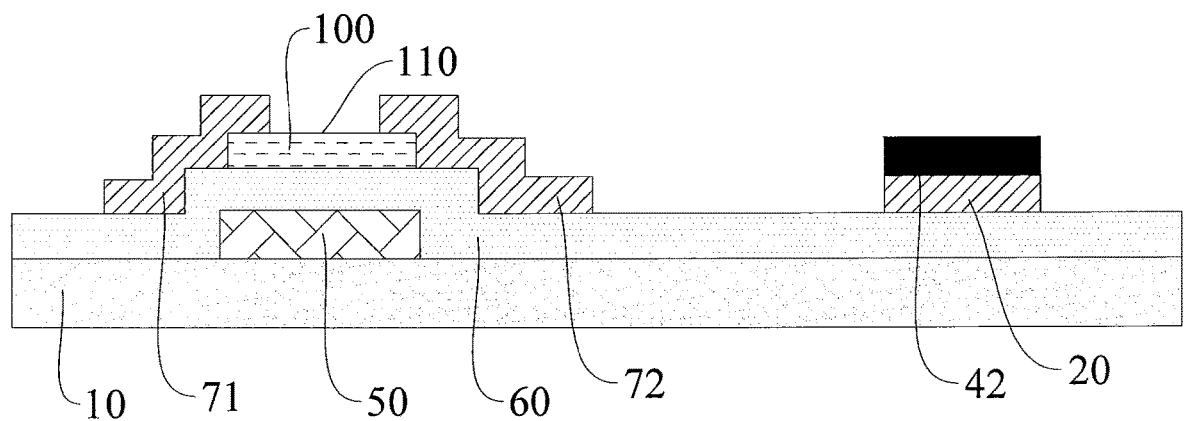
FIG. 9 is a schematic partial sectional view of an array substrate during the process of manufacturing an array substrate in another embodiment of the present disclosure.

Next, the metal thin film 70 is etched using the first preparation layer 42 and the second preparation layer 43 as a mask plate to form a source, a drain and the data line, and then removing the second preparation layer 43 above the source and the drain, as shown in FIG. 9. According to the embodiment of the disclosure, the source and drain electrodes and the data line are formed using the first preparation layer 42 and the second preparation layer 43 as a mask plate, thus the number of mask plates required in the manufacturing process can be reduced, thereby reducing the production cost.

Figure 10:
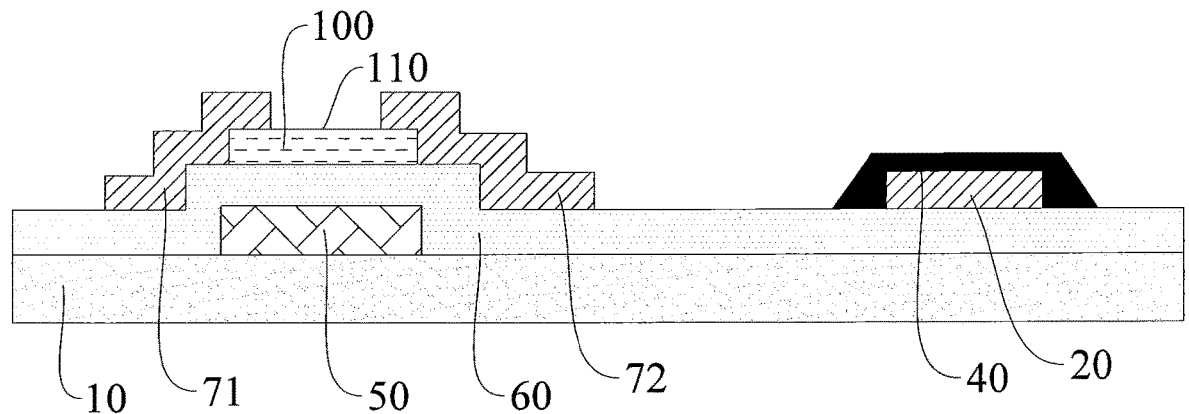
FIG. 10 is a schematic partial sectional view of an array substrate during the process of manufacturing an array substrate in a further embodiment of the present disclosure.

According to an embodiment of the disclosure, after the data line is formed, the first preparation layer 42 on the upper surface of the data line 20 may be heated to obtain a light shielding layer 40, which is schematically shown in FIG. 10.

According to the embodiments of the present disclosure, the heating temperature is not limited, and those skilled in the art can set a temperature according to the specific material of the preparation layer.

According to an embodiment of the disclosure, in order to further improve the electrical characteristics of the thin film transistor, after forming the source, the drain, and the data line, a channel 110 (a portion of the active layer between the source and the drain, as shown in FIG. 9) of the thin film transistor may be subjected to ashing treatment. Thus, the material for forming the preparation layer which remains in the channel of the thin film transistor can be well cleaned to improve the characteristics and the stability of the thin film transistor. Therefore, according to some embodiments of the disclosure, the method for manufacturing an array substrate further comprises: after forming the source, the drain, and the data line, performing ashing treatment to a portion of the active layer between the source and the drain.

According to an embodiment of the disclosure, the method for manufacturing an array substrate further comprises steps of forming the pixel electrode 80, the passivation layer 90, and the common electrodes (e.g., the first common electrode 31 and the second common electrode 32). Specific manufacturing processes are not limited herein, and those skilled in the art can make flexible selections as needed. Schematic views of the array substrate comprising the pixel electrode, the passivation layer, and the common electrodes are illustrated in FIG. 1 to FIG. 4.

According to an embodiment of the disclosure, the above method for manufacturing an array substrate may be used to fabricate the array substrate described above, the requirements on the structures such as the pixel electrode, the passivation layer, the common electrode, the data line, the light shielding layer, the source, the drain, and the like are the same as described above, and will not be repeated herein.

In a further aspect, the present disclosure provides a display device. According to an embodiment of the present disclosure, the display device comprises the array substrate described above. According to the embodiment of the disclosure, specific types of the above display device are not limited, and those skilled in the art can make flexible selections as needed. In an embodiment of the disclosure, specific types of the above display device include a mobile phone, a computer, a television, a game machine, and any electronic devices comprising a display function.

Certainly, those skilled in the art can understand that, in addition to the array substrate described above, the above display device further comprises structures or components necessary for a complete display device. Taking a mobile phone as an example, in addition to the array substrate described above, it further comprises structures or components such as a color filter substrate, a glass cover, a housing, a voice module, a camera module, a fingerprint module, and the like.

Moreover, the terms "first" and "second" herein are used for descriptive purposes only and are not to be construed as indicating or implying a relative importance or implicitly suggesting the number of technical features indicated. Thus, features defined with "first" and "second" may include one or more of the features either explicitly or implicitly. In the description of the present disclosure, the meaning of "a plurality" is two or more unless specified otherwise.

In the description of the specification, descriptions with reference to the terms "an embodiment", "some embodiments", "example", "specific example", "some examples" and the like mean that specific features, structures, materials or characteristics described in conjunction with the embodiments or examples are comprised in at least one embodiment or example of the present disclosure. In the specification, the schematic representation of the above term is not necessarily directed to the same embodiment or example. Furthermore, the specific features, structures, materials or characteristics described may be combined in a suitable manner in any one or more embodiments or examples. In addition, various embodiments or examples described in the specification, as well as features of various embodiments or examples, may be combined, in the case of causing no conflict.

While embodiments of the present disclosure have been illustrated and described above, it is to be understood that the above-described embodiments are illustrative and are not to be construed as limiting the present disclosure. Those skilled in the art can make variations, amendments, substitutions and modifications to the above-described embodiments without departing the scope of the present disclosure.

The invention claimed is:

1. An array substrate comprising:
a substrate;
a data line on the substrate, wherein the data line comprises a first surface closest to the substrate and parallel to a bottom surface of the substrate; and
a light shielding layer on the substrate,
wherein the light shielding layer is configured to overlap the data line such that at least a portion of the data line in a display area of the array substrate is not exposed,
wherein the array substrate further comprises a first common electrode and a second common electrode above the light shielding layer in a vertical direction perpendicular to the bottom surface of the substrate,
wherein an orthographic projection of the first common electrode on the substrate and an orthographic projection of the data line on the substrate have a first overlapping region, and
wherein an orthographic projection of the second common electrode on the substrate and the orthographic projection of the data line on the substrate have a second overlapping region.

2. The array substrate according to claim 1,
wherein the data line comprises an upper surface extending along a length direction of the data line and two side faces connecting the upper surface and the first surface,
wherein the light shielding layer comprises a first portion in contact with the upper surface of the data line, and a second portion in contact with one of the two side faces of the data line,
wherein the second portion of the light shielding layer comprises an outer surface inclined relative to the first surface of the data line, and
wherein an angle between the outer surface of the second portion of the light shielding layer and the first surface of the data line is greater than or equal to 45° and less than or equal to 90°.

3. The array substrate according to claim 2, wherein the first portion of the light shielding layer has a thickness greater than or equal to 2.8 μm.

4. The array substrate according to claim 2, wherein a distance between an outermost edge of the second portion of the light shielding layer and the one of the two side faces of the data line in contact with the second portion of the light shielding layer is greater than or equal to 4.2 µm.

5. The array substrate according to claim 1,
wherein the array substrate further comprises a pixel electrode,
wherein the pixel electrode, the first common electrode and the second common electrode are arranged above the light shielding layer in a vertical direction perpendicular to the bottom surface of the substrate, and
wherein each of the first common electrode and the second common electrode comprises a plurality of electrode blocks spaced apart from each other.

6. The array substrate according to claim 5, wherein the array substrate further comprises:
a thin film transistor; and
a passivation layer between the pixel electrode and the first common electrode or the second common electrode,
wherein one of a source or a drain of the thin film transistor is electrically connected to the pixel electrode.

7. A method for manufacturing the array substrate according to claim 1, comprising:
forming the data line on the substrate, the data line comprising the first surface closest to the substrate and parallel to the bottom surface of the substrate, an upper surface extending along a length direction of the data line, and side faces connecting the upper surface and the first surface;
forming a first preparation layer on the upper surface of the data line with a light shielding material; and
heating the first preparation layer such that a material of the first preparation layer overlaps the side faces of the data line to obtain the light shielding layer.

8. The method according to claim 7, further comprising:
forming a gate, a gate insulating layer, and an active layer on the substrate successively;
forming a metal thin film overlapping the gate, the gate insulating layer, and the active layer;
forming a primary preparation layer on the metal thin film using the light shielding material, and performing a patterning process on the primary preparation layer to form the first preparation layer and a second preparation layer separated from each other;
etching the metal thin film using the first preparation layer and the second preparation layer as a mask plate to form a source, a drain, and the data line, and
removing the second preparation layer on the source and the drain.

9. The method according to claim 8, wherein the method further comprises:
after forming the source, the drain, and the data line, performing an ashing treatment to a portion of the active layer between the source and the drain.

10. A display device comprising the array substrate according to claim 1.

11. The display device according to claim 10,
wherein the data line comprises an upper surface extending along a length direction of the data line and two side faces connecting the upper surface and the first surface,
wherein the light shielding layer comprises a first portion in contact with the upper surface and a second portion in contact with one of the two side faces,
wherein the second portion of the light shielding layer comprises an outer surface inclined relative to the first surface of the data line,
wherein an angle between the outer surface of the second portion of the light shielding layer and the first surface of the data line is greater than or equal to 45° and less than or equal to 90°.

12. The display device according to claim 10, wherein the array substrate further comprises a pixel electrode,
wherein the pixel electrode, the first common electrode and the second common electrode are arranged above the light shielding layer in a vertical direction perpendicular to the bottom surface of the substrate, and
wherein each of the first common electrode and the second common electrode comprises a plurality of electrode blocks spaced apart from each other.

13. The display device according to claim 12, wherein the array substrate further comprises:
a thin film transistor, and
a passivation layer between the pixel electrode and the first common electrode or the second common electrode,
wherein one of a source or a drain of the thin film transistor is electrically connected to the pixel electrode.

14. An array substrate comprising:
a substrate;
a data line on the substrate, wherein the data line comprises a first surface closest to the substrate and parallel to a bottom surface of the substrate; and
a light shielding layer on the substrate,
wherein the light shielding layer is configured to overlap the data line such that at least a portion of the data line in a display area of the array substrate is not exposed,
wherein the array substrate further comprises a first common electrode and a second common electrode above the light shielding layer in a vertical direction perpendicular to the bottom surface of the substrate,
wherein a first gap is between an orthographic projection of the first common electrode on the substrate and an orthographic projection of the data line on the substrate,
wherein a second gap is between an orthographic projection of the second common electrode on the substrate and the orthographic projection of the data line on the substrate, and
wherein sizes of the first gap and the second gap are both less than or equal to 1 µm.

15. An array substrate comprising:
a substrate;
a data line on the substrate, wherein the data line comprises a first surface closest to the substrate and parallel to a bottom surface of the substrate; and
a light shielding layer on the substrate,
wherein the light shielding layer is configured to overlap the data line such that at least a portion of the data line in a display area of the array substrate is not exposed,
wherein the array substrate further comprises a first common electrode and a second common electrode above the light shielding layer in a vertical direction perpendicular to the bottom surface of the substrate,
wherein a gap between an orthographic projection of one of the first common electrode or the second common electrode on the substrate and an orthographic projection of the data line on the substrate has a size less than or equal to 1 µm, and wherein an orthographic projection of another of the first common electrode or the second common electrode on the substrate and the orthographic projection of the data line on the substrate have an overlapping region.

* * * * *